(12) United States Patent
Goldbach et al.

(10) Patent No.: US 7,354,816 B2
(45) Date of Patent: Apr. 8, 2008

(54) FIELD EFFECT TRANSISTOR WITH GATE SPACER STRUCTURE AND LOW-RESISTANCE CHANNEL COUPLING

(75) Inventors: Matthias Goldbach, Dresden (DE); Ralph Stömmer, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 11 days.

(21) Appl. No.: 11/363,263

(22) Filed: Feb. 28, 2006

(65) Prior Publication Data
US 2006/0194443 A1    Aug. 31, 2006

(30) Foreign Application Priority Data
Feb. 28, 2005  (DE)  .................... 10 2005 009 019

(51) Int. Cl.
*H01L 21/8238*  (2006.01)
(52) U.S. Cl. ............... 438/201; 438/211; 438/257; 438/606
(58) Field of Classification Search .............. None
See application file for complete search history.

(56) References Cited
U.S. PATENT DOCUMENTS
6,849,516 B2   2/2005  Feudel et al.

| | | |
|---|---|---|
| 2002/0142535 A1* | 10/2002 | Ho et al. .................... 438/201 |
| 2004/0183106 A1 | 9/2004 | Kim et al. |
| 2004/0233727 A1* | 11/2004 | Iwase et al. ........... 365/185.22 |
| 2004/0245564 A1* | 12/2004 | Ogura et al. ................ 257/315 |
| 2004/0256653 A1 | 12/2004 | Iwata et al. |
| 2004/0266109 A1 | 12/2004 | Ogura et al. |
| 2005/0001262 A1 | 1/2005 | Iwase et al. |
| 2006/0145235 A1* | 7/2006 | Lam et al. .................. 257/314 |

* cited by examiner

*Primary Examiner*—Duy-Vu N Deo
(74) *Attorney, Agent, or Firm*—Edell, Shapiro & Finnan, LLC

(57) ABSTRACT

Spacer structures of field effect transistor structures are enhanced at least in sections with immobile charge carriers. The charge accumulated in the spacer structures induces an enhancement zone of mobile charge carriers in the underlying semiconductor substrate. The enhancement zone reduces the resistance of a channel coupling between the respective source/drain region and a channel region of the respective field effect transistor structure, wherein the channel region being controlled by a potential of a gate electrode. Source/drain regions drawn back from the gate electrode of the field effect transistor structure reduce an overlap capacitance between the gate electrode and the respective source/drain regions. A method for fabricating transistor arrangements having n-FETs and p-FETs with enhanced spacer structures.

31 Claims, 14 Drawing Sheets

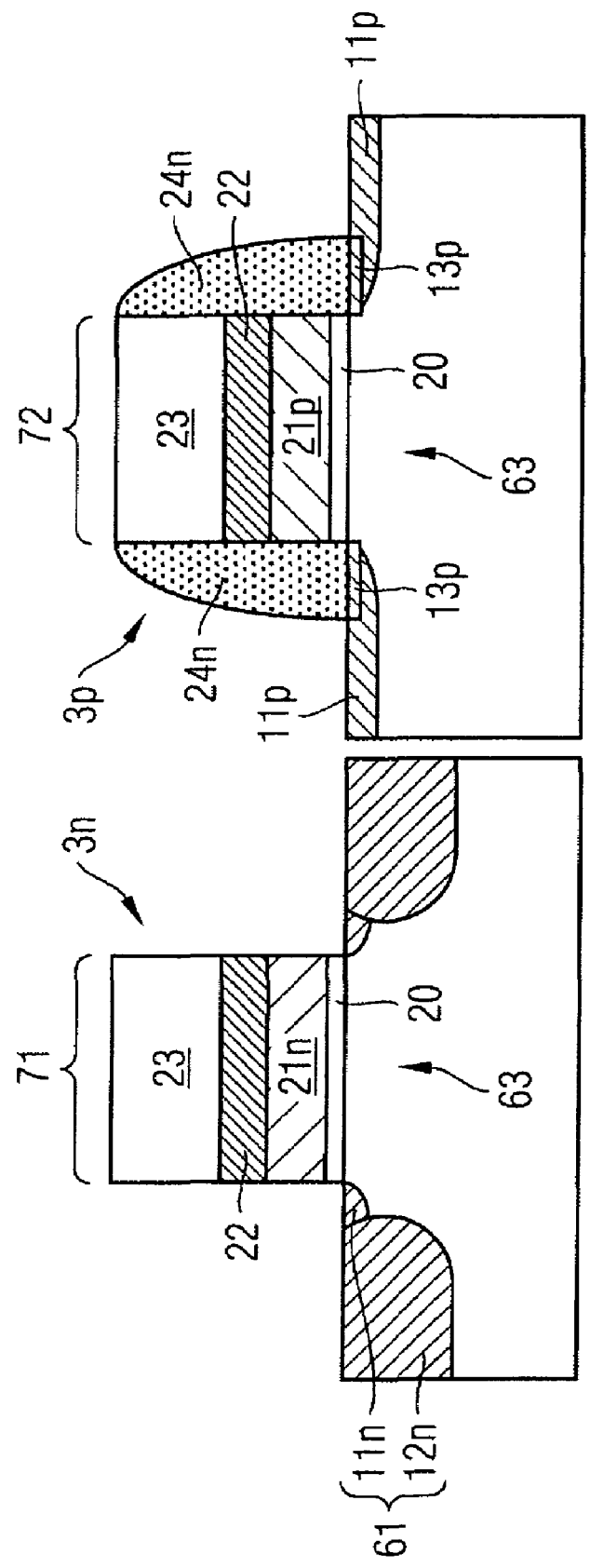

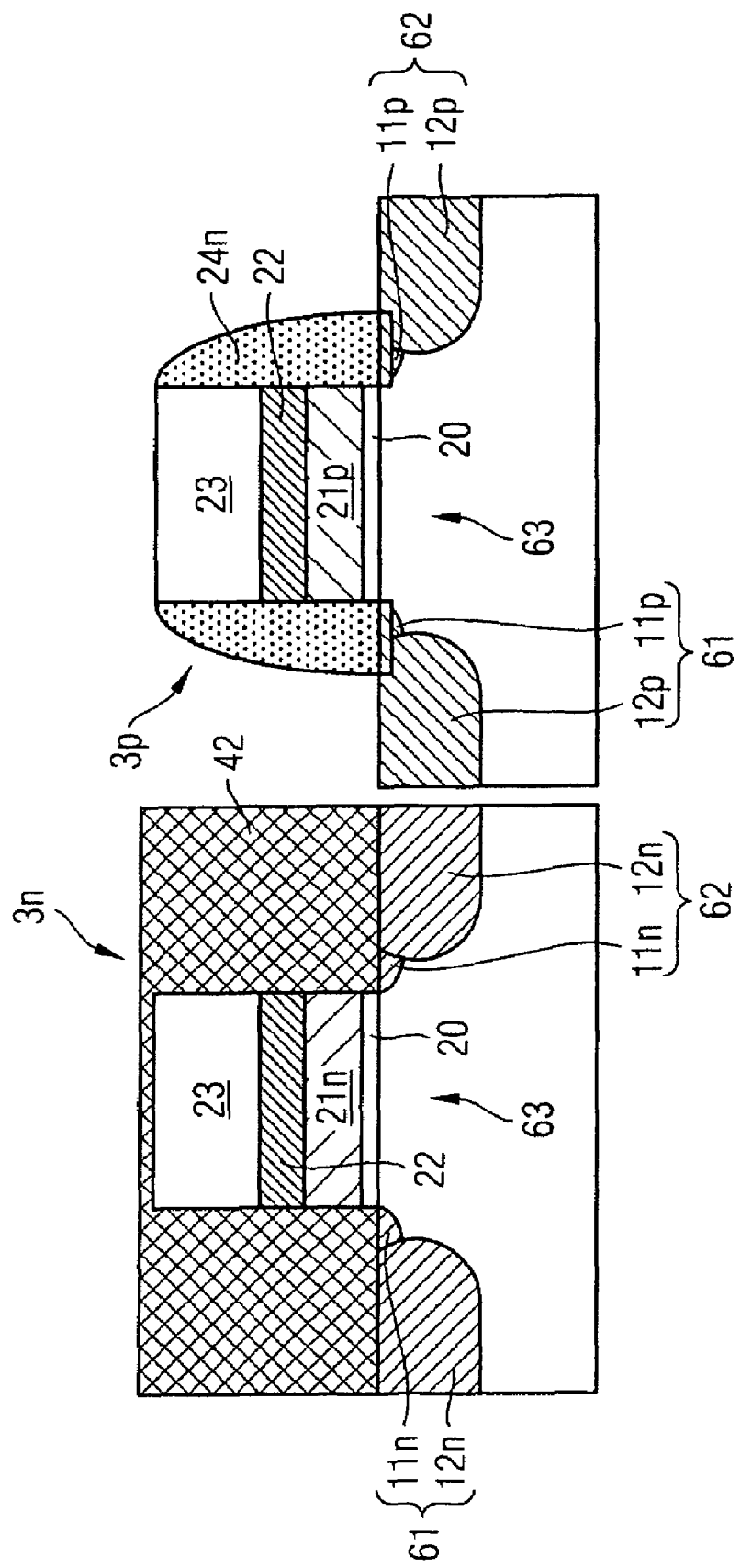

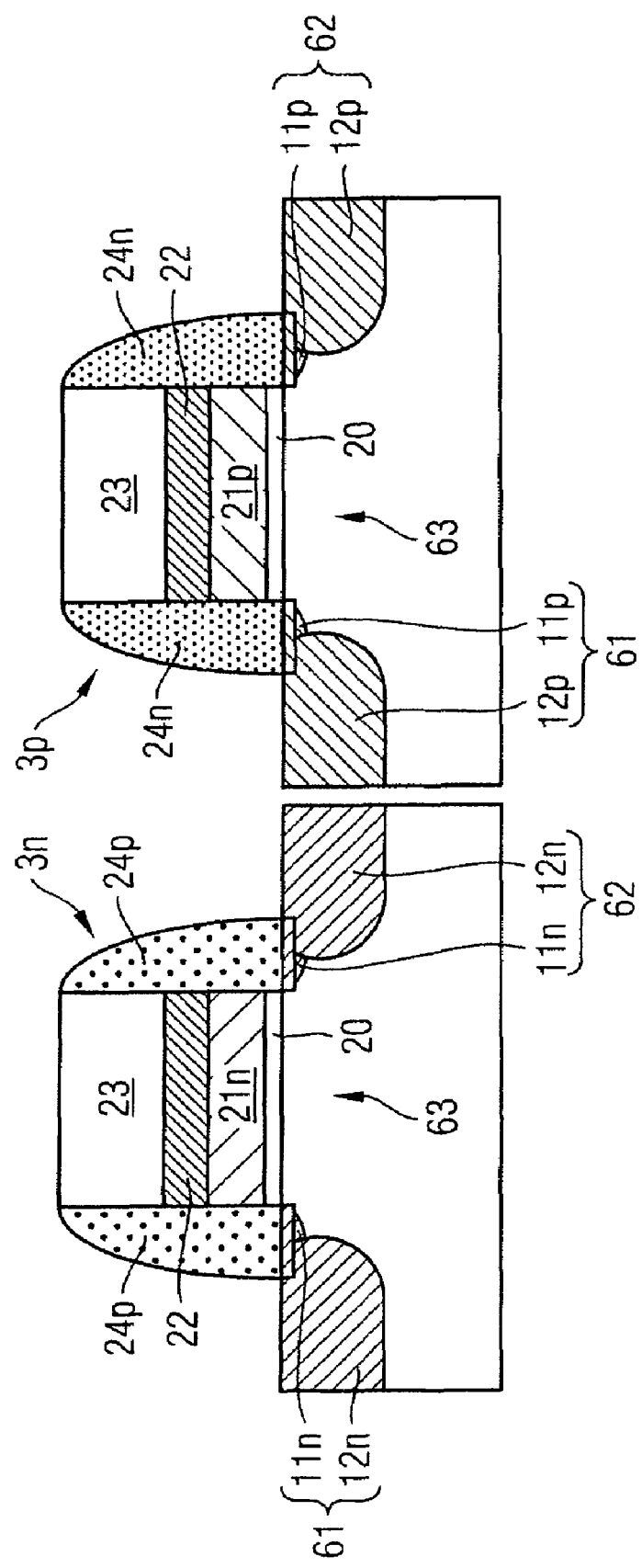

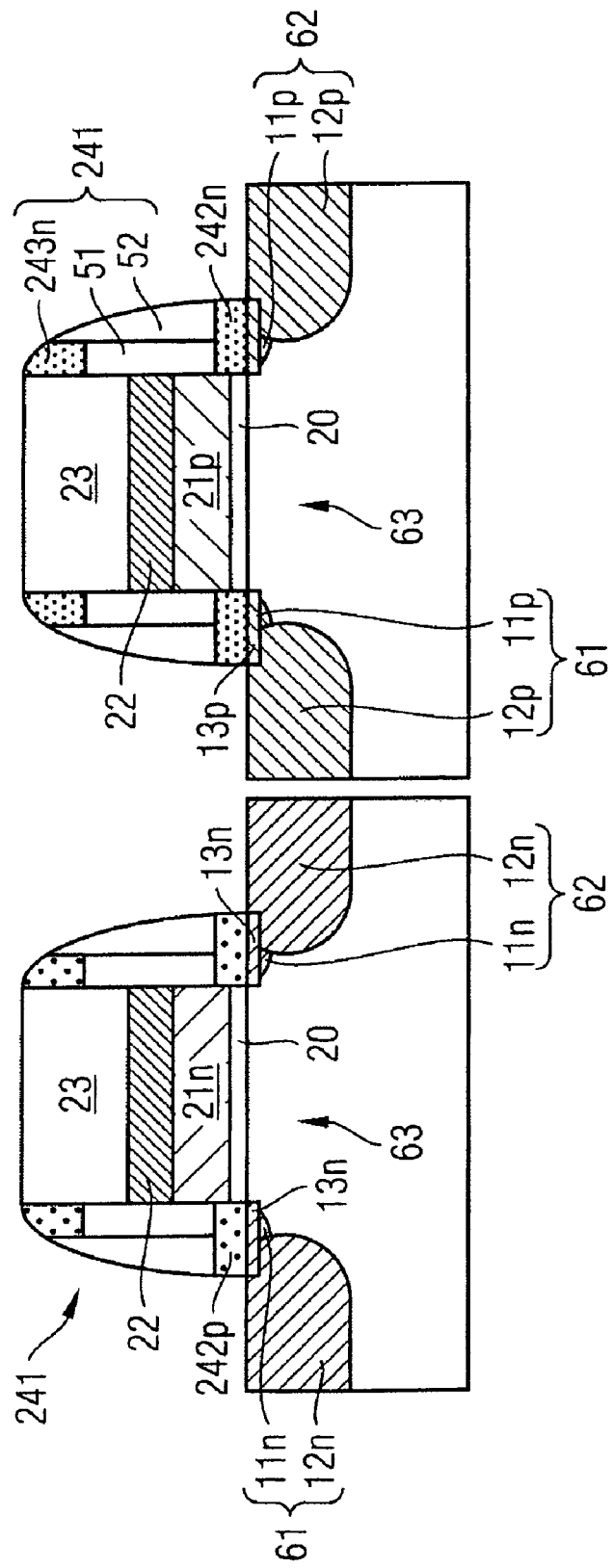

FIELD EFFECT TRANSISTOR WITH GATE SPACER STRUCTURE AND LOW-RESISTANCE CHANNEL COUPLING

CROSS REFERENCE TO RELATED APPLICATIONS

This application claims priority under 35 USC §119 to German Application No. DE 102005009019.2, filed on Feb. 28, 2005, and titled "Field Effect Transistor With Gate Spacer Structure and Low-Resistance Channel Coupling," the entire contents of which are hereby incorporated by reference.

FIELD OF THE INVENTION

The invention relates to a field effect transistor structure having first and second source/drain regions, which are each formed as sections of a first conductivity type in a semiconductor substrate. The first and second source/drain regions adjoin a structure surface of the semiconductor substrate, such that a channel region is formed between the two regions. The channel region is intrinsically conducting or of a second conductivity type opposite to the first conductivity type. A gate electrode is arranged adjacent to the channel region wherein a gate dielectric separates the gate electrode from the channel region. In addition, a first dielectric spacer structure is bearing on the structure surface, and the spacer structure adjoins the gate electrode in a manner oriented toward the first source/drain region. The invention further relates to methods for fabricating transistor arrangements having in each case at least one n-channel field effect transistor and one p-channel field effect transistor.

BACKGROUND

A field effect transistor structure which is formed with respect to an n-channel field effect transistor (n-FET) is illustrated schematically in cross section in FIG. 11. The n-FET comprises an active zone formed in a semiconductor substrate 1 and also a gate structure 2 bearing on a structure surface 10 of the semiconductor substrate 1. In the active zone, two source/drain regions 61, 62 are spaced apart by a channel region 63. The source/drain regions 61, 62 are n-doped sections of the semiconductor substrate 1 and adjoin the structure surface 10 of the semiconductor substrate 1. The channel region 63 is intrinsically conducting or p-doped. The gate structure 2 comprises a gate electrode 26, which is arranged over the channel region 63 above the structure surface 10 and is insulated from the semiconductor substrate 1 by a gate dielectric 20. Furthermore, the gate structure 2 has spacer structures 24, which are arranged along vertical sidewalls of the gate electrode 26 with respect to the structure surface 10 and in each case bear on the structure surface 10 in a manner oriented toward one of the source/drain regions 61, 62.

In the example illustrated, the source/drain regions 61, 62 result in each case from the superimposition of an n-doped basic section 12n with an n-doped extension section 11n. In a manner governed by the fabrication, the boundary edges of the basic sections 12n which are in each case oriented toward the channel region 63 are essentially aligned with the outer edges of the spacer structures 24. The boundary edges of the extension sections 11n which are oriented toward the channel region 63 are essentially aligned with the outer edges of the gate electrode 26 and, in the example shown, essentially adjoin a section of the channel region 63 which can be controlled by a potential at the gate electrode 26. The extension sections 11n form a low-resistance coupling of a channel formed in the region of the gate dielectric 20 in the conducting state of the n-FET to the respective source/drain region 61, 62.

The extension sections 11n and basic sections 12n are in each case produced by ion implantation.

The boundary edges essentially define the originally implanted region. Within the implanted region, the dopant concentration is essentially uniform directly after the implantation. Diffusion of the dopant results in gradual transitions at the boundary edges of the individual doped sections.

In the off state of the n-FET, the two source/drain regions 61, 62 are electrically insulated from one another. When a suitable potential is applied to the gate electrode 26, mobile electrons are accumulated in a section of the channel region 63 which adjoins the gate dielectric 20, and they form a conductive channel between the two source/drain regions 61, 62. The n-FET then begins to conduct.

Due to the dopant gradient as well, the extension sections 11n undercut the gate electrode 26. As the respective source/drain region 61, 62 increasingly overlaps the gate electrode 26, a parasitic overlap capacitance between the respective source/drain region 61, 62 and the gate electrode 26 increases. An increased parasitic capacitance delays the switching of the n-FET between conducting and blocking state and consequently increases the switching losses.

The parasitic capacitance between the gate electrode 26 and the respective source/drain region 61, 62 is reduced by the inner edge—oriented toward the channel region 63—of the respective source/drain region 61, 62 or of the respective extension section 11n being drawn back outward from the channel region 63. The connection of the comparatively heavily doped basic section 12n of the respective source/drain region 61, 62 to the section of the channel region 63 which can be influenced by a potential at the gate electrode 26 is then formed by a comparatively weakly doped section and the nonreactive resistance of the coupling of the conductive channel to the respective source/drain region 61, 62 is high.

A reduction of the overlap capacitance between the gate electrode 26 and the respective source/drain region 61, 62 is accompanied by an increased nonreactive resistance of the channel coupling between the region controlled by the gate electrode 26 and the respective source/drain region 61, 62.

In order to optimize the overlap capacitance relative to the resistance of the channel coupling, the overlap between the extension section 11n and the gate electrode 26 is chosen such that the doping outside the section which can be influenced by an electric field at the gate electrode 26 is high enough to ensure a sufficiently low-resistance channel coupling in the conducting state.

As the slope of the dopant gradient increases, the extension section can be drawn back further from the channel region with a consistently low nonreactive lead resistance. The accompanying reduction of the overlap capacitance is partly compensated for, however, by the simultaneously required reduction of the thickness of the gate dielectric in the transition to smaller feature sizes and greater slopes in the dopant gradient.

SUMMARY

The invention provides a field effect transistor structure which has both a low overlap capacitance between the gate electrode and the respective source/drain region and a low-resistance channel coupling, the nonreactive resistance of which can be set by the fabrication process. According to the invention, by means of charge carriers which are fixed in the spacer structures, an enhancement zone with mobile charge carriers is produced in the semiconductor substrate beneath the spacer structures. The enhancement zone supports the connection of the respective source/drain region to the channel formed in the channel region in the conducting state. The boundary edge of the respective source/drain region, generally that of an extension section (extension implants), can be drawn back from the channel region and the overlap capacitance between the respective source/drain region and the gate electrode can thereby be reduced.

The field effect transistor structure comprises a first and a second source/drain region. The two source/drain regions are sections of a semiconductor substrate which are doped by a first conductivity type. The two source/drain regions adjoin a structure surface of the semiconductor substrate. A channel region is provided in the semiconductor substrate between the two source/drain regions. The channel region is intrinsically conducting or doped in accordance with a second conductivity type opposite to the first conductivity type.

A gate electrode is arranged over the structure surface above the channel region, the gate electrode being separated from the channel region by a gate dielectric. A first dielectric spacer structure bearing on the structure surface adjoins the gate electrode, the spacer structure being oriented toward the first source/drain region.

According to the invention, the first spacer structure has, at least in a control section adjoining the semiconductor substrate, a surface charge density of immobile charge carriers of a second charge type corresponding to the second conductivity type of greater than $1e11/cm^2$.

In a preferred manner, the surface charge density is more than $1e12/cm^2$, so that the density of mobile charge carriers in the enhancement zone advantageously at least matches a typical charge carrier density in the respectively adjoining source/drain region.

The immobile charge carriers within the first spacer structure induce, in the semiconductor substrate, a first enhancement zone of mobile charge carriers of a first charge type—opposite to the second charge type—corresponding to the first conductivity type. The first enhancement zone is formed in a section of the semiconductor substrate which adjoins the structure surface beneath the first spacer structure.

The enhancement zone reduces a lead resistance between the first source/drain region and a channel which is formed in the conducting state of the field effect transistor beneath the gate dielectric from mobile charge carriers of the first charge type.

In an advantageous manner, the first source/drain region is formed in such a way that it essentially adjoins the first enhancement zone. The first source/drain region is then advantageously spaced apart by the first enhancement zone from that section of the channel region which is controlled by the potential at the gate electrode. An overlap capacitance between the first source/drain region and the gate electrode is advantageously significantly reduced.

In an alternatively preferred manner, the first source/drain region at least partly overlaps or overlies the first enhancement zone. Compared with customary field effect transistor structures, by virtue of the higher number of mobile charge carriers, the nonreactive resistance of the channel coupling is reduced and also the overlap capacitance is reduced by virtue of the source/drain region being spaced apart from the channel.

If the first source/drain region directly adjoins that section of the channel region which can be controlled by the gate electrode, then an advantageously very low lead resistance results.

In accordance with one preferred embodiment of the field effect transistor structure according to the invention, a second dielectric spacer structure bears on the structure surface, the spacer structure adjoining the gate electrode in a manner oriented toward the second source/drain region. The second spacer structure has, at least in a partial section adjoining the semiconductor substrate, a surface charge density of immobile charge carriers of the second charge type of greater than $1e11/cm^2$ and induces a second enhancement zone of mobile charge carriers of the first charge type in the adjoining section of the semiconductor substrate.

The preferred embodiments that have already been described for the first source/drain region arise in an equivalent manner for the positioning of the second source/drain region with respect to the second enhancement zone.

In a further preferred manner, the charge carrier density in the spacer structure or spacer structures is chosen such that the charge carrier density of charge carriers of the first charge type in the enhancement zones in the conducting state of the field effect transistor structure is at least 10% of the charge carrier density in the respectively adjoining source/drain regions, so that the lead resistance is highly reduced.

In accordance with one preferred embodiment of the field effect transistor structure according to the invention, the charge carrier density of charge carriers of the first conductivity type in the respective enhancement zone in the conducting state of the field effect transistor structure corresponds at least to the charge carrier density in the respectively adjoining source/drain region.

In an advantageous manner, the source/drain regions are in each case formed from at least two mutually superimposed implantation sections having different extents.

In accordance with a further preferred embodiment of the field effect transistor structure according to the invention, the entire spacer structure in each case has a doping of the immobile charge carriers of the second charge type. The respective control section then comprises the entire spacer structure.

A comparatively simple process flow advantageously arises for the fabrication of gate structures with such fashioning of the spacer structures.

In an alternatively preferred manner, the height of the respective control section over the structure surface is at most ten times the thickness of the gate dielectric. In an advantageous manner, a parasitic capacitance produced between the gate electrode and the charge fixed in the spacer structure or other structures is reduced and a method for forming differently doped control sections in p-FETs and n-FETs which is based on partially pulling back a covered sacrificial layer in the spacer structures is at the same time practicable.

If the first conductivity type is the p conductivity type, then aluminum oxide is a preferred material for forming the control section.

If the first conductivity type is the n conductivity type, then preferred materials for forming the control section are silicon oxide, silicon nitride and oxides of rare earth elements.

A transistor arrangement according to the invention comprises in each case at least one n-FET and one p-FET. Both the n-FET and the p-FET correspond to one of the field effect transistor structures described above, for the n-FET the first conductivity type being the n conductivity type and for the p-FET the first conductivity type being the p conductivity type.

In one preferred embodiment, at least in each case the control sections of the spacer structures assigned to the n-FET and to the p-FET are made of different materials. The parameters of the channel coupling of both types of field effect transistors are then advantageously decoupled from one another. In particular, the respectively appropriate charge carrier type for the respective transistor type can be provided in the enhancement zone.

In transistor arrangements having n-FETs and p-FETs, positively charged immobile charge carriers are to be provided in the spacer structures of the n-FETs and negatively charged charge carriers are to be provided in the spacer structures of the p-FETs. Therefore, a method for fabricating gate electrodes for a transistor arrangement which comprises at least in each case one n-FET and one p-FET is specified below.

In accordance with the method according to the invention, firstly a first stack structure and a second stack structure are formed on a structure surface of a semiconductor substrate. First spacer structures are provided on vertical sidewalls of the first and second stack structures with respect to the structure surface, the spacer structures bearing on the structure surface and being enhanced with charge carriers with charges of a first charge type.

A first mask is provided, which covers the second stack structure, while the first stack structure is not covered. The first spacer structures are removed from the first stack structure. The first mask is then removed.

Second spacer structures enhanced with charge carriers of a second charge type, which is opposite to the first charge type, are formed on the vertical sidewalls of the first stack structure.

In a preferred manner, the formation of the second spacer structure comprises providing second spacer structures both on vertical sidewalls of the first stack structure and on the second stack structures that are supplemented by the first spacer structures to form second gate structures.

A second mask, which covers the first gate structure and does not cover the second gate structure, is applied. With masking by the second mask, the second spacer structures are removed from the second gate structure.

After the removal of the second mask, the first gate structures that have emerged from the first stack structures, which gate structures are assigned to n-FETs for instance, have spacer structures enhanced with positive charge carriers. The second gate structures, which are then assigned to p-FETs, have spacer structures enhanced with negatively charged charge carriers.

The second method according to the invention—described below—for fabricating gate electrodes for transistor arrangements having at least one n-FET and p-FET relates to spacer structures which are enhanced with immobile charge carriers only in sections.

A first stack structure which is assigned to an n-FET, for instance, and also a second stack structure, which is then assigned to a p-FET, are formed on a structure surface of a semiconductor substrate.

Precursor spacer structures are formed on vertical sidewalls of the first and second stack structures, for instance by conformal deposition and anisotropic etching-back.

A first mask is provided, which covers the second stack structure, while the first stack structure is not covered. Sections of the precursor spacer structures of the first stack structure which adjoin the semiconductor substrate are pulled back, divots being formed between the precursor spacer structures and the semiconductor substrate.

After the removal of the first mask, the divots are filled with a material which is enhanced with charge carriers with an electrical charge of the first charge type. In this case, control sections of the spacer structures emerge from the filling of the divots along the semiconductor substrate.

A second mask is provided which covers the first stack structure and does not cover the second stack structure.

Sections of the precursor spacer structures of the second stack structure which adjoin the semiconductor substrate are pulled back, forming divots oriented along the semiconductor substrate in the precursor spacer structures.

After the removal of the second mask, the divots are filled with a material which is enhanced with charge carriers having a charge of the second charge type. Second spacer structures extending along the vertical sidewalls of the second stack structures emerge from the respective precursor spacer structures. The control sections of the second spacer structures result from the filling of the divots.

In a particularly preferred manner, the formation of the precursor spacer structures comprises applying two partial layers made of different materials and also a spacer etch which acts in a similar manner on the two partial layers. The sections of the precursor spacer structures which adjoin the semiconductor substrate in accordance with the method described above are then formed in each case by horizontal sections of the first, lower partial layer within the precursor spacer structures.

In a preferred manner, the material of the lower partial layer is tetraethyl orthosilane TEOS and the material of the upper partial layer is silicon nitride. The divots are formed by means of a wet etching step in which the TEOS is pulled back selectively relative to the silicon nitride.

In a particularly preferred manner, the first mask is identical with an implantation mask for forming sections of source/drain regions of the first conductivity type. The second mask is preferably identical with an implantation mask for partly forming the source/drain regions of the second conductivity type, for instance for forming basic sections of the source/drain regions which are aligned with the spacer structures.

In a further preferred manner, the formation of the first implantation sections, for instance those of extension sections of the source/drain regions, is effected prior to the provision of the spacer structures and in a manner aligned with the stack structures.

With the masks being formed correspondingly, the methods according to the invention also make it possible to form asymmetrical spacer structures that are doped only on one side. In this case, the respective mask additionally covers semilaterally the stack structures that are to be processed on one side.

BRIEF DESCRIPTION OF THE DRAWINGS

The invention and its advantages are explained in more detail below with reference to the figures. In this case, mutually corresponding components and structures are respectively designated by identical reference symbols. In the figures, in each case in schematic cross sections.

DETAILED DESCRIPTION

Figure 1:
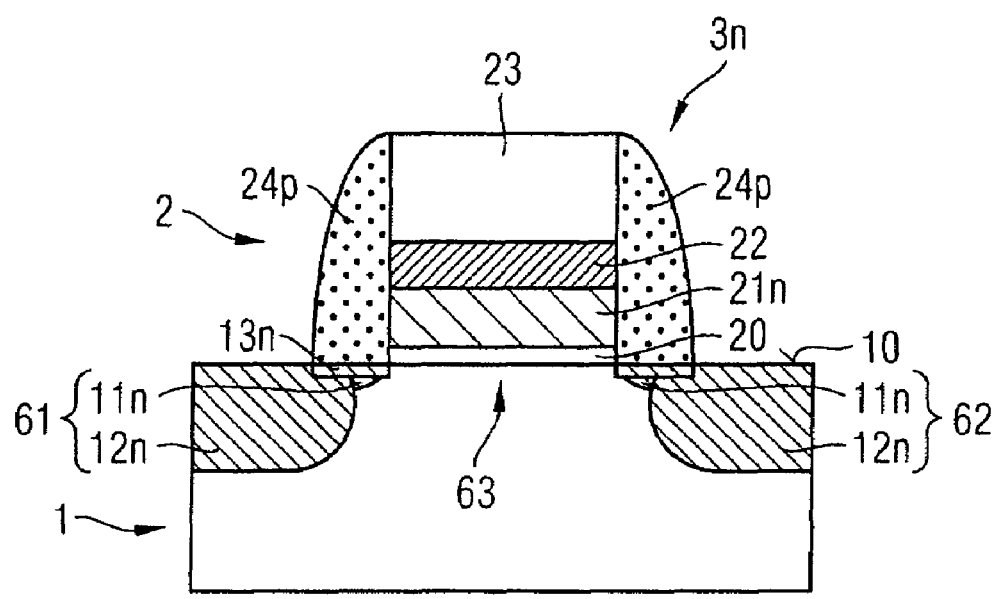
FIG. 1 shows a first exemplary embodiment of an n-channel field effect transistor according to the invention with homogenous spacer structures on both sides.
Figure 11:
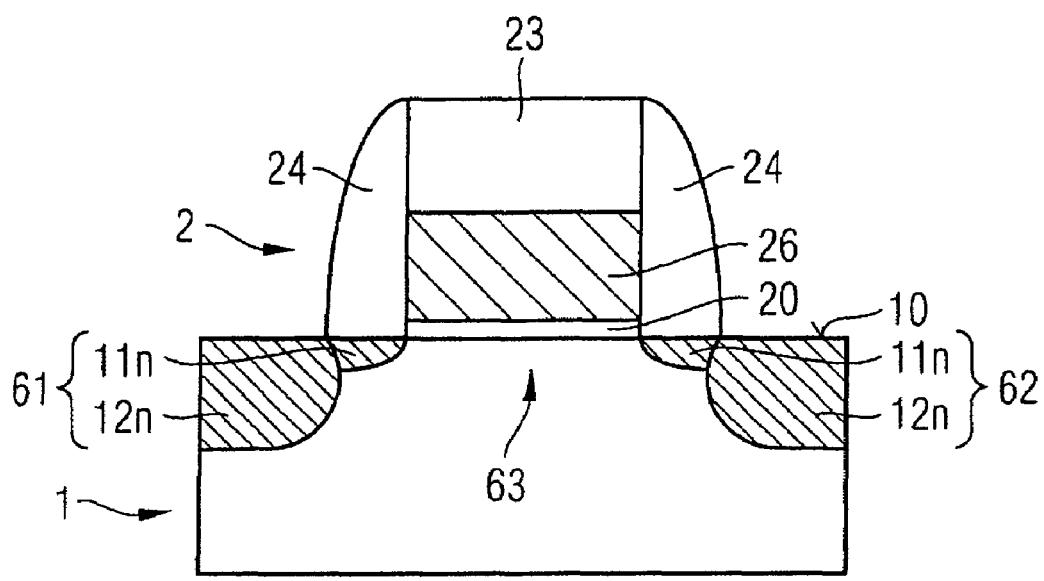
FIG. 11 shows a conventional field effect transistor structure.

The n-FET $3n$ illustrated in FIG. 1 has an active zone—formed in a semiconductor substrate 1—with two source/drain regions 61, 62 each comprising a basic section $12n$ and an extension section $11n$. The two source/drain regions 61, 62 are spaced apart from one another by a channel region 63. Above the channel region 63, a gate structure 2 bears on a structure surface 10 of the semiconductor substrate 1. A gate conductor section $21n$ of the gate structure 2 made of n-doped polysilicon forms a gate electrode in accordance with FIG. 11 and is insulated from the semiconductor substrate 1 by a gate dielectric 20. A highly conductive section 22 made of a metal or a metal compound bears on the n-doped gate conductor section 21 and an insulator section 23, for instance made of silicon nitride, bears on the highly conductive section 22. Vertical sidewalls—with respect to the substrate surface 10—of the gate structure 2 formed by the gate conductor section $21n$, the highly conductive section 22 and the insulator section 23 are adjoined by spacer structures $24p$ adjoining the structure surface 10 outside the channel region 63. The spacer structures $24p$ are enhanced with positively charged immobile charge carriers.

The positive charge accumulated in the spacer structures $24p$ induces, in the semiconductor substrate 1, enhancement zones $13n$ with electrons, which are formed in each case along the structure surface 10 beneath the spacer structures $24p$.

In this exemplary embodiment, the enhancement zones $13n$ largely overlap the source/drain regions 61, 62.

The nonreactive resistance of a channel coupling or the contact resistance of a channel which forms in the conducting state of the n-FET beneath the gate dielectric 20 along the structure surface 10 between the source/drain regions 61, 62 is reduced by the two enhancement zones $13n$. Moreover, the inner boundary edges of the extension sections $11n$ respectively facing the channel region 63 can be drawn back from the channel region 63, thereby reducing an overlap between the gate conductor section $21n$ and the respective extension section $11n$.

Figure 2:
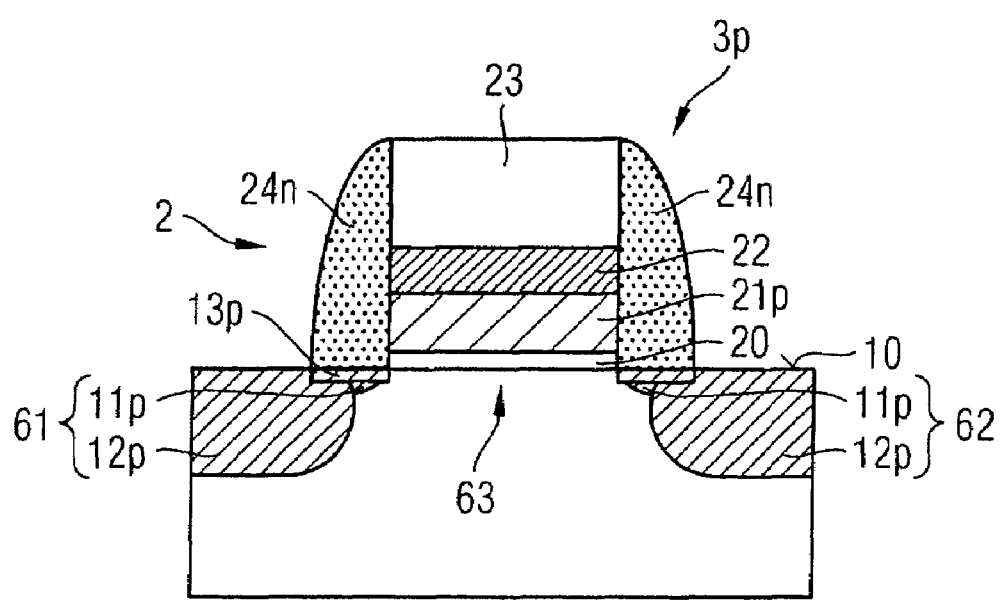
FIG. 2 shows a first exemplary embodiment of a p-channel field effect transistor according to the invention with homogenous spacer structures on both sides.
Figure 3:
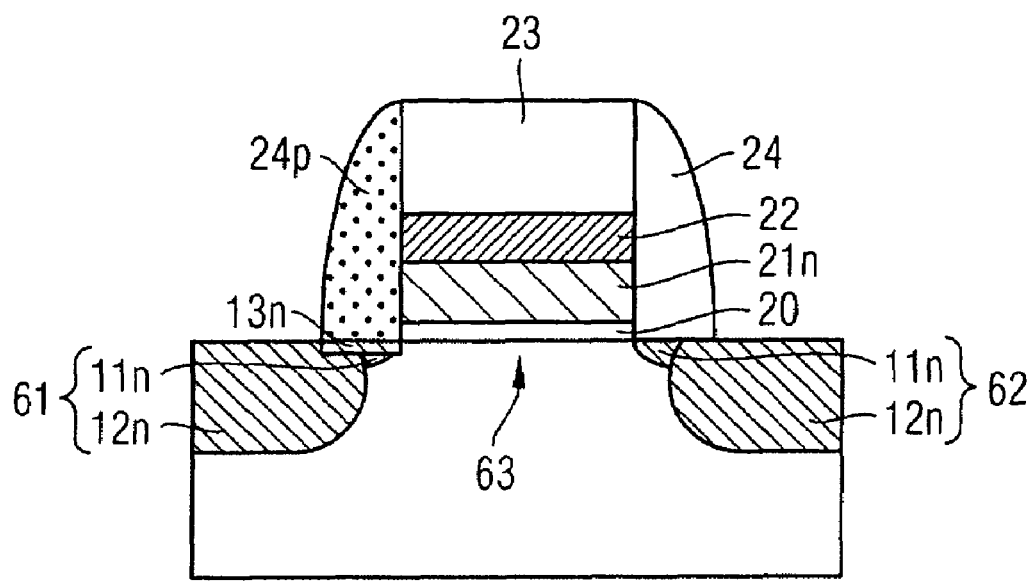
FIG. 3 shows a second exemplary embodiment of an n-channel field effect transistor according to the invention with asymmetrical spacer structures.

The exemplary embodiment of a p-FET $3p$ as illustrated in FIG. 2 differs from the exemplary embodiment already described for the n-FET $3n$ of FIG. 1 by virtue of the negative charge accumulated in the spacer structures $24n$, by virtue of p-doped extension sections $11p$ and p-doped basic sections $12p$ for the definition of the source/drain regions 61, 62, and also by virtue of a p-doped gate conductor section $21p$. Mobile positively charged holes are accumulated in the enhancement zones $13p$ beneath the n-doped spacer structures $24n$ enhanced with negatively charged charge carriers. The field effect transistor structure illustrated in FIG. 3 has a spacer structure enhanced with positive charge carriers only on one side. The second spacer structure 24 is undoped, or has a surface charge density of less than $1\ e11/cm^2$. Accordingly, an enhancement zone $13n$ is formed beneath the enhanced spacer structure $24p$ only on one side.

Figure 4:
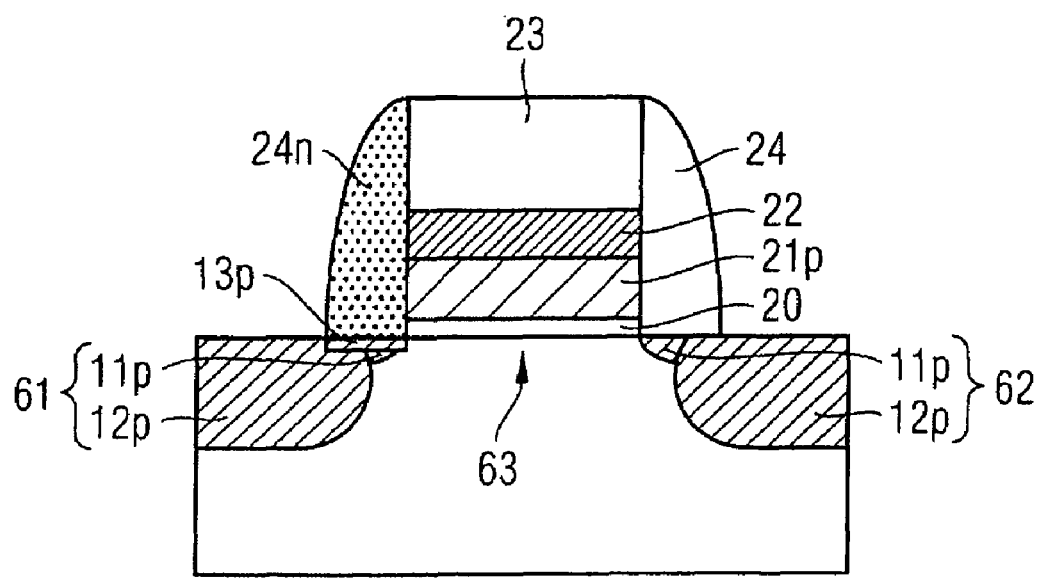
FIG. 4 shows a second exemplary embodiment of a p-channel field effect transistor according to the invention with asymmetrical spacer structures.
Figure 5:
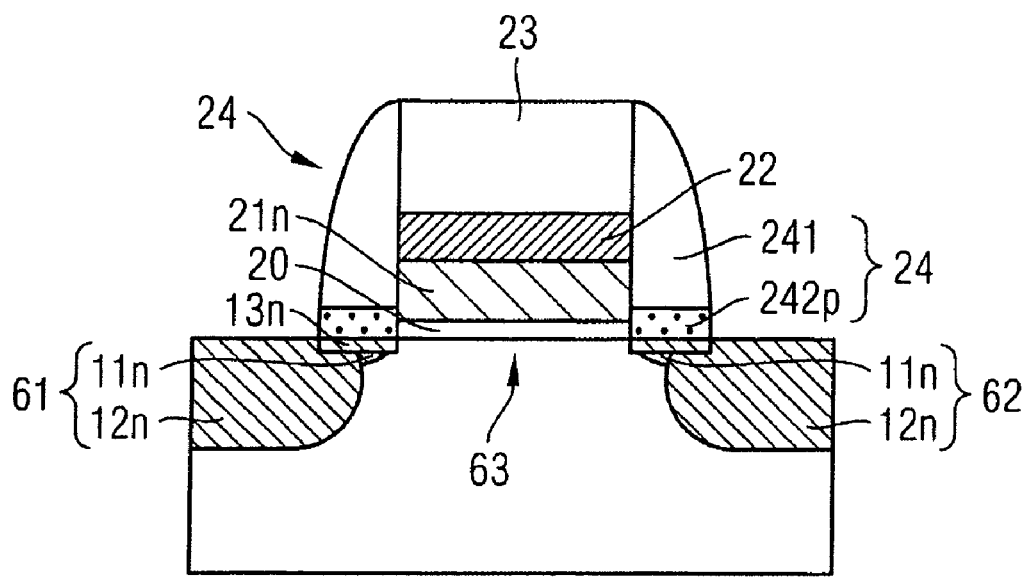
FIG. 5 shows a third exemplary embodiment of an n-channel field effect transistor according to the invention with symmetrical, partially enhanced spacer structures.
Figure 6:
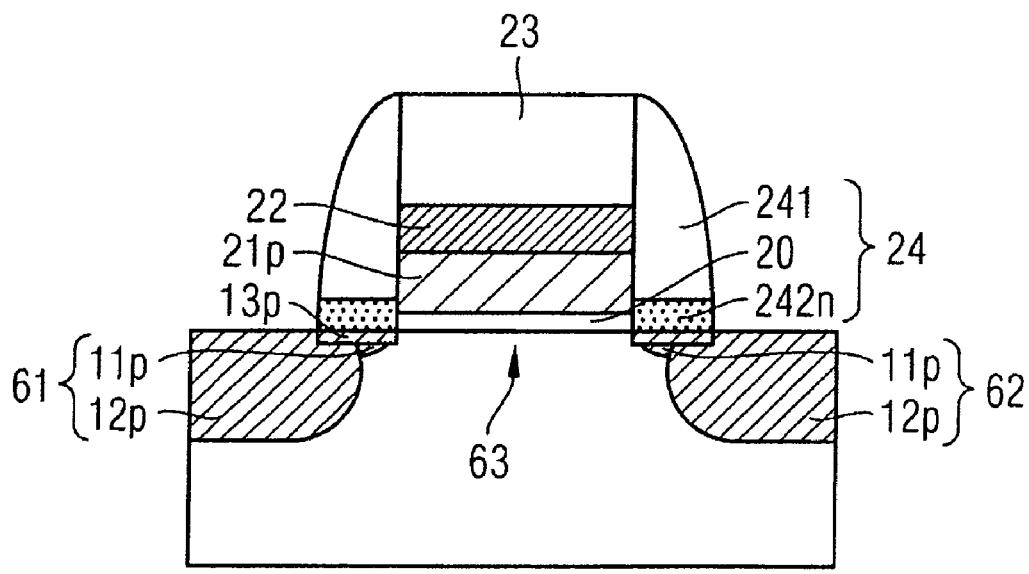
FIG. 6 shows a third exemplary embodiment of a p-channel field effect transistor according to the invention with symmetrical, partially enhanced spacer structures.
Figure 7:
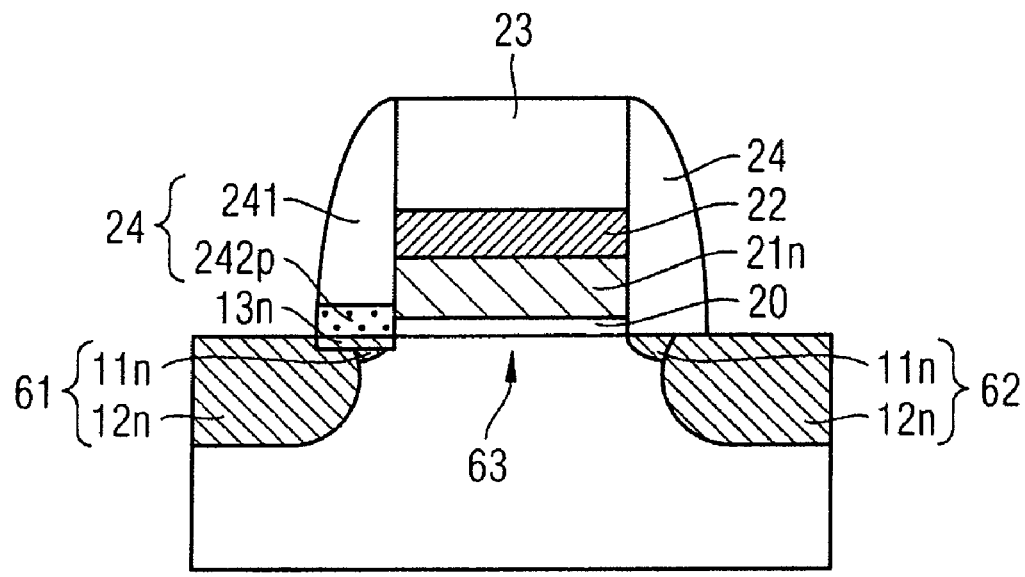
FIG. 7 shows a fourth exemplary embodiment of an n-channel field effect transistor according to the invention with a spacer structure partially enhanced on one side.
Figure 8:
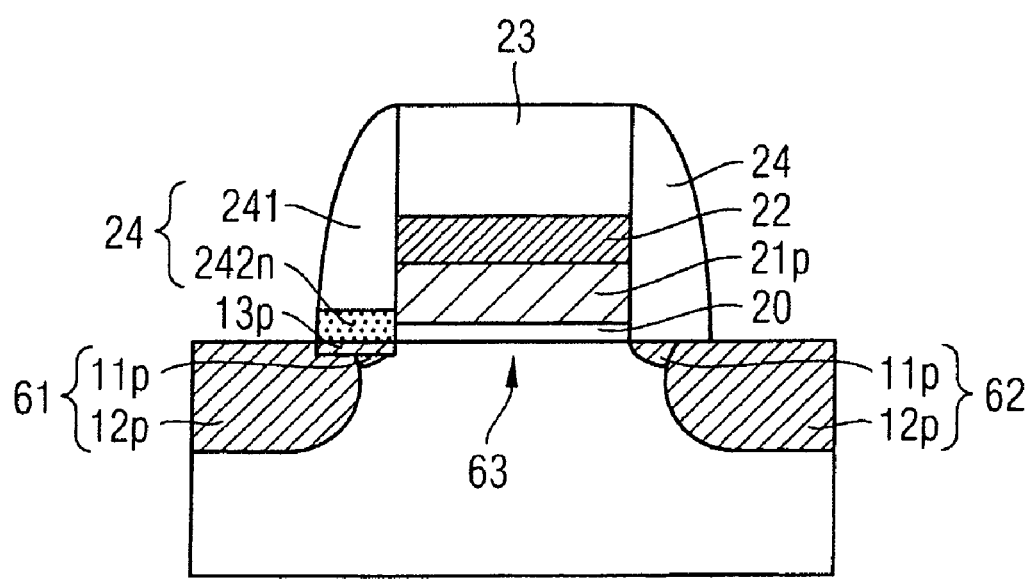
FIG. 8 shows a fourth exemplary embodiment of a p-channel field effect transistor according to the invention with a spacer structure partially enhanced on one side.

FIG. 4 illustrates a p-FET with two different spacer structures $24n$, 24. An enhancement zone $13p$ formed by holes is formed beneath the spacer structures $24n$ enhanced with negative charge carriers, while such an enhancement zone is absent beneath the non-enhanced spacer structure 24.

The FETs illustrated in FIGS. 5 to 8 correspond to the FETs illustrated in FIGS. 1 to 4 with the difference that in each case only a control section $242n$, $242p$—adjoining the semiconductor substrate 1—of the respective spacer structure $24n$, $24p$ is enhanced with immobile charge carriers. The remaining sections 241 of the spacer structures outside the respective control sections $242p$, $242n$ are not enhanced with charge carriers. A parasitic capacitance between the enhanced control sections $242p$, $242n$ of the spacer structures and the respective gate conductor section $21n$, $21p$ and also the highly conductive section 22 is reduced.

With reference to FIG. 9, the method according to the invention for fabricating transistor arrangements having n-FETs and p-FETs in accordance with a first exemplary embodiment of the invention is illustrated in a simplified manner on the basis of a sequence of process steps.

FIGS. 9A to 9E in each case illustrate the processing of an n-FET $3n$ in the left-hand half of the figure and the fabrication of a p-FET $3p$ in the right-hand half of the figure.

A structure surface 10 of a semiconductor substrate 1 has applied to it a gate dielectric 20, a layer made of a gate conductor material, a layer made of a highly conductive material and a layer made of an insulator material, which are patterned jointly in a photolithographic process. The uncovered sidewalls of the stack structures 71, 72 produced from the gate conductor layer are oxidized.

By means of ion implantation, n-doped and p-doped extension sections $11n$, $11p$ are formed in a manner aligned with the edges of the stack structures 71, 72 produced from the layer stack, and the gate conductor layer is doped in accordance with the respective transistor type.

A dielectric layer is deposited in a process environment in which negatively charged charge carriers are accumulated in the deposited layer. The deposited layer has a conformal character.

In the course of a directional anisotropic spacer etch, spacer structures $24n$ emerge from the deposited dielectric layer on the vertical sidewalls of the stack structures 71, 72.

A first mask 41 is applied, which covers regions assigned to the p-FETs 3p, while regions assigned to the n-FETs 3n are not covered. With masking by the first mask 41, n-doped basic sections 12n of the n-FETs 3n are implanted. The implantation is effected in a manner self-aligned with outer edges of the enhanced spacer structures 24n that lie on the opposite side to the stack structures 71, 72.

Figure 9A:
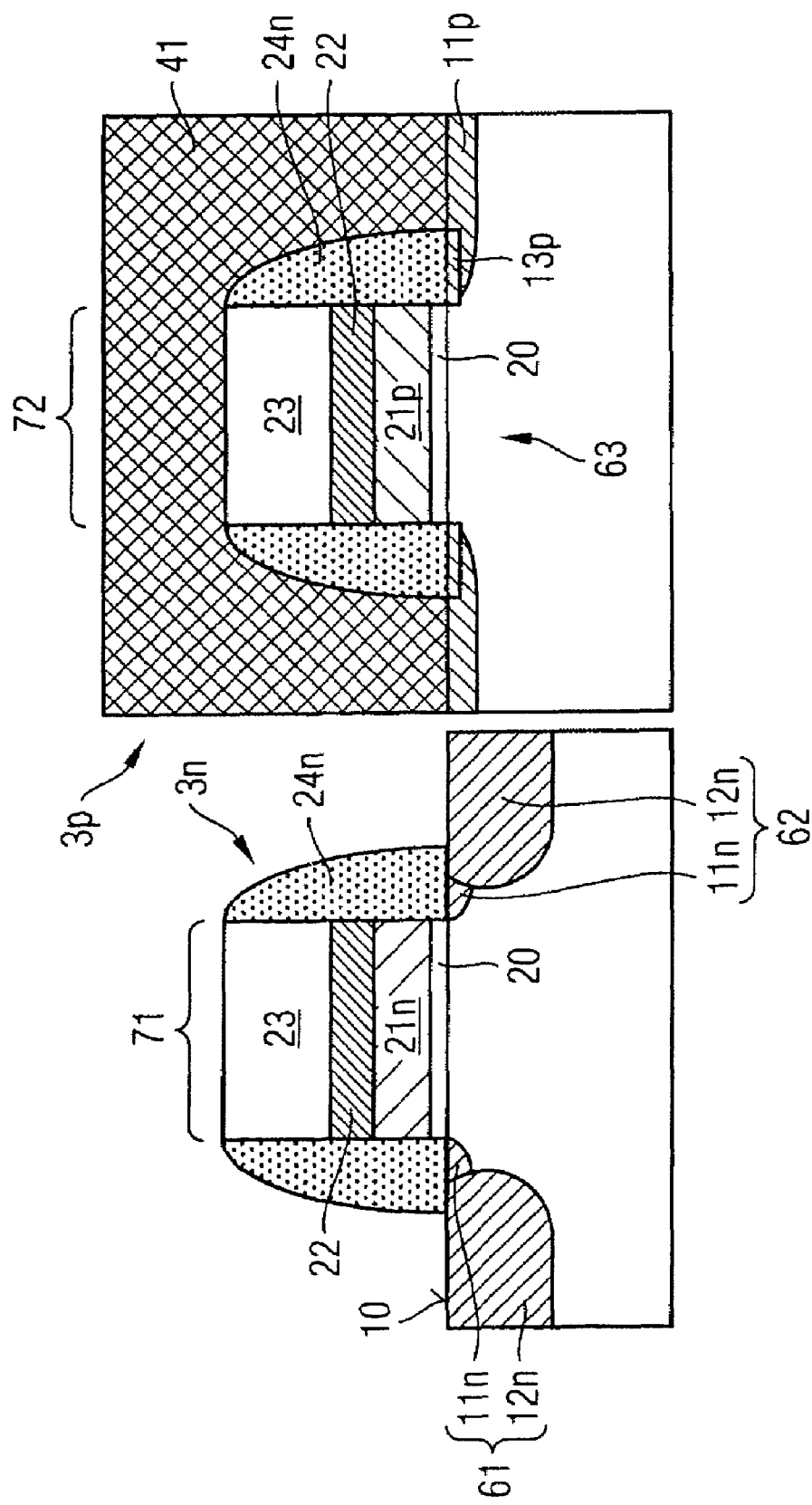
FIG. 9 shows an exemplary embodiment of a method according to the invention for forming doped spacer structures for transistor arrangements having n-FETs and p-FETs.

FIG. 9A illustrates the region of an n-FET 3n in the left-hand half of the figure and the region of a p-FET 3p in the right-hand half of the figure. The stack structures 71, 72 each comprise a gate dielectric 20 bearing on a semiconductor substrate 1 in sections, a gate conductor section 21n, 21p bearing on the gate dielectric 20, the gate conductor section being n-doped in the region of the n-FET 3n and p-doped in the region of the p-FET 3p, a highly conductive section 22 bearing on the gate conductor section 21n, 21p, and also an insulator section 23 bearing on the highly conductive section 22. Vertical sidewalls of the stack structures 71, 72 formed by the respective gate conductor section 21p, 21n, the highly conductive section 22 and the insulator section 23 are covered by spacer structures 24n enhanced with immobile negative charge carriers. Extension sections 11n, 11p aligned with the outer edges of the stack structures 71, 72 or gate conductor sections 21n, 21p are formed in the semiconductor substrate 1, the extension sections being p-doped in the region of the p-FETs 3p and n-doped in the region of the n-FETs 3n. Basic sections 12n of the source/drain regions 61, 62 of the n-FETs 3n are aligned with the outer edges of the spacer structures 24n.

The region assigned to the p-FET 3p is covered by a first mask 41.

The first mask 41 required for masking the implantation for forming the n-doped basic sections 12n is used for selectively pulling back the spacer structures in the region of the n-FETs 3n and is subsequently removed.

In FIG. 9B, the spacer structures 24n enhanced with negative charge carriers are correspondingly absent in the region of the n-FETs.

The regions assigned to the n-FETs 3n are covered by a second mask 42, the regions assigned to the p-FETs 3p remaining uncovered. With the aid of an implantation masked by the second mask 42, the p-doped basic sections 12p assigned to the p-FETs 3p are formed in a manner aligned with the outer edges of the spacer structures 24n.

This results in the structure with fully formed p-FETs 3p as illustrated in FIG. 9C. The p-doped extension sections 11p and also the p-doped basic sections 12p form two source/drain regions 61, 62 of the p-FET 3p. The spacer structures 24n doped with negative charge carriers induce enhancement zones 13p enhanced with holes beneath the spacer structures 24n between a channel region that can be controlled by a potential at the gate conductor section 21p and the respective source/drain region 61, 62.

The second mask 42 is removed. In a process environment in which positive charge carriers are accumulated in a layer to be deposited, a further dielectric layer is deposited conformally and pulled back anisotropically.

Figure 9D:
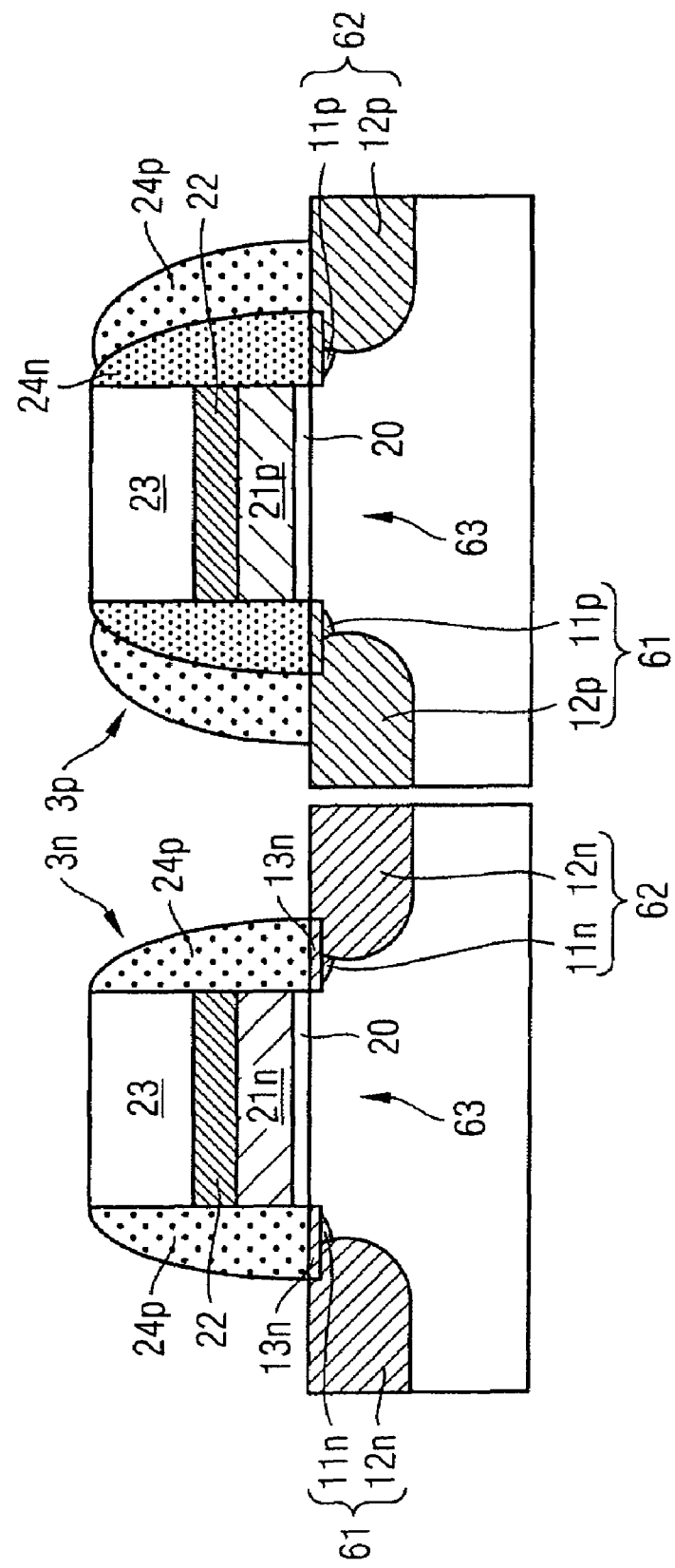

In accordance with FIG. 9D, spacer structures 24p enhanced with positive charge carriers are formed on vertical sidewalls of the stack structures 71 of the n-FETs 3n and also along the spacer structures 24n enhanced with negative charge carriers in the region of the p-FET 3p.

A further mask, which is patterned similarly or identically to the second mask 42, is provided, so that the n-FETs 3n are covered and the p-FETs 3p are not covered. The spacer structures 24p enhanced with positive charge carriers are removed in the region of the p-FETs 3p. Thus resulting, in accordance with FIG. 9E, in a transistor arrangement having in each case an n-FET 3n, a p-FET 3p, and gate structures 2, in accordance with FIGS. 1 and 2.

The method illustrated with reference to FIG. 10 differs from the method described previously first of all in that, instead of a dielectric layer enhanced with negative charge carriers, two non-enhanced partial layers made of materials having different etching properties are deposited successively and essentially conformally in each case. A first spacer etch acts essentially in the same way on both partial layers, so that precursor spacer structures 73 having partial sections 51, 52 made of residual sections of the two partial layers are formed on the vertical sidewalls of the stack structures 2 both for an n-FET 3n and for a p-FET 3p.

The p-FETs 3p are covered by a first mask corresponding to the mask 41 of FIG. 9A. An implantation for forming the n-doped basic sections 12n is performed in the region of the n-FETs 3n. Using the same mask, in the region of the n-FETs 3n the material of the first partial layer is isotropically pulled back selectively with respect to the material of the second partial layer.

Figure 10A:
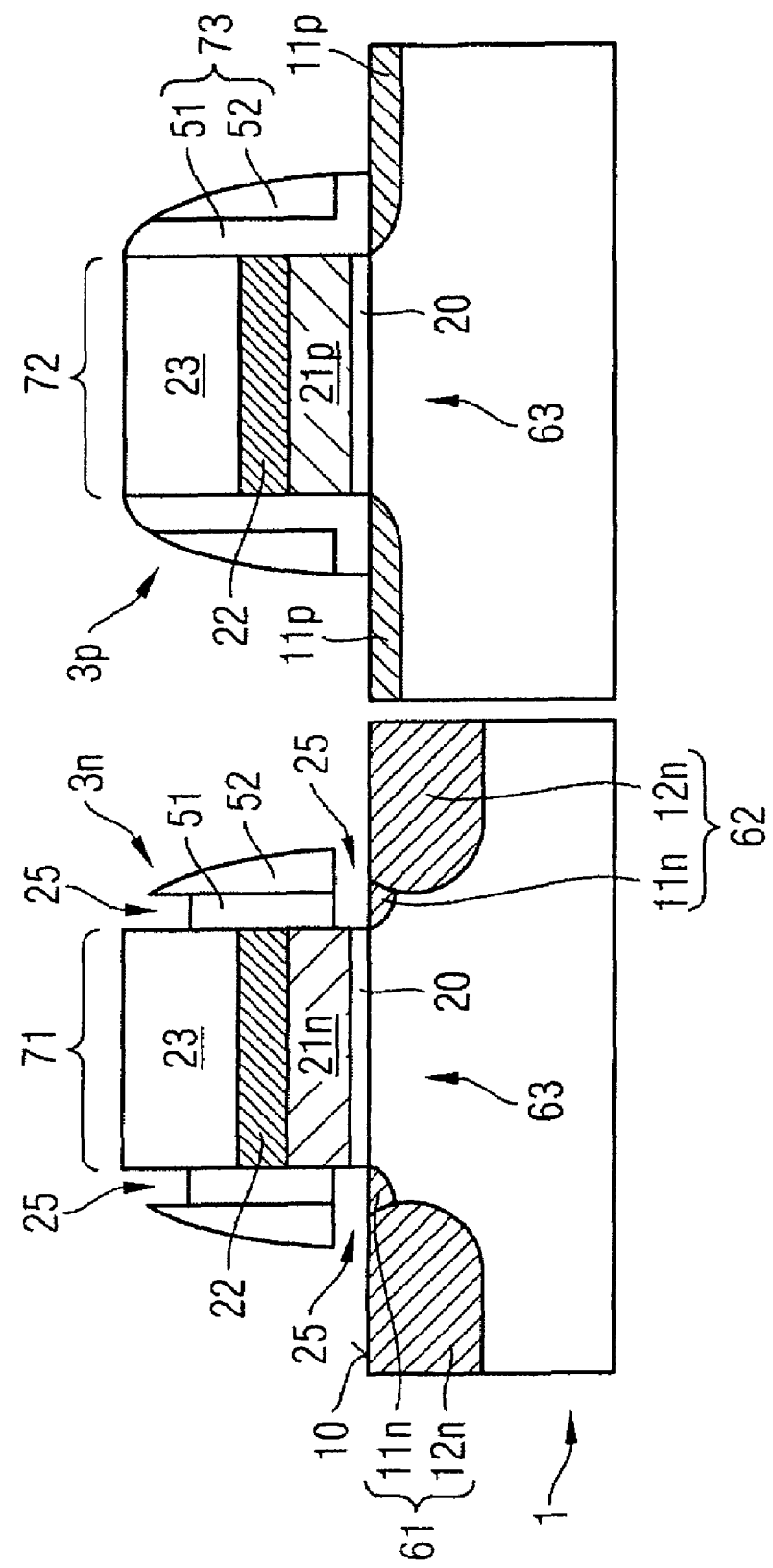
FIG. 10 shows a further exemplary embodiment of a method according to the invention for fabricating partially enhanced spacer structures for transistor arrangements having n-FETs and p-FETs.

The right-hand half of FIG. 10A illustrates the precursor spacer structures 73 formed from residual sections of the first and second partial layers. The residual sections 51 of the first partial layer extend along the sidewalls of the stack structures 71, 72 and are covered by the residual sections 52 of the second, upper partial layer.

The left-hand half of FIG. 10A illustrates the divots 25 produced by the isotropic etch in the sections of the first partial layer 51. The mask for forming the n-doped basic sections 12n and also for selectively processing the divots 25 in the region of the n-FETs 3n has already been removed.

A dielectric material is deposited under process conditions under which the deposited layer is enhanced with positively charged charge carriers. The deposited layer is etched back isotropically.

Figure 10B:
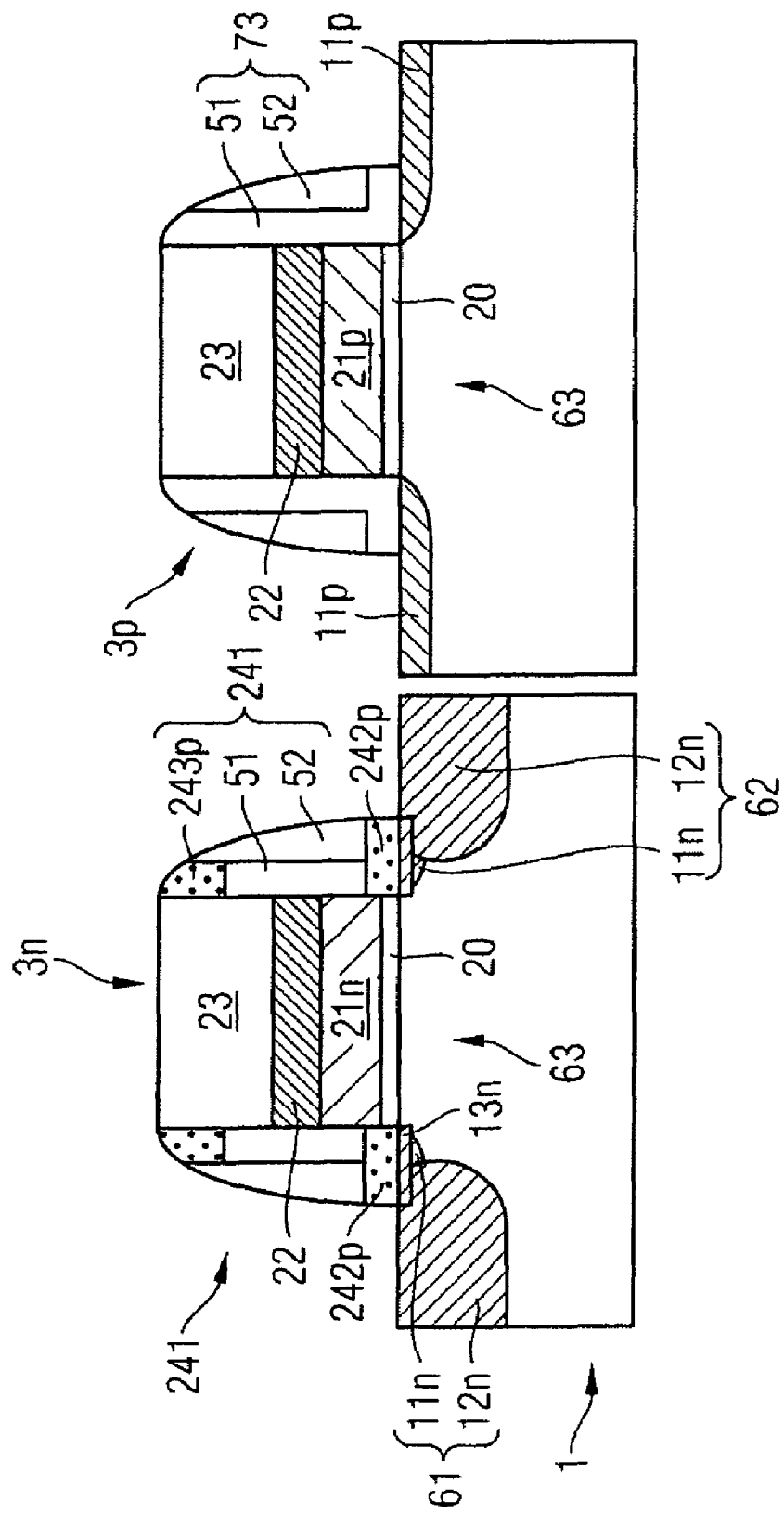
Figure 10C:
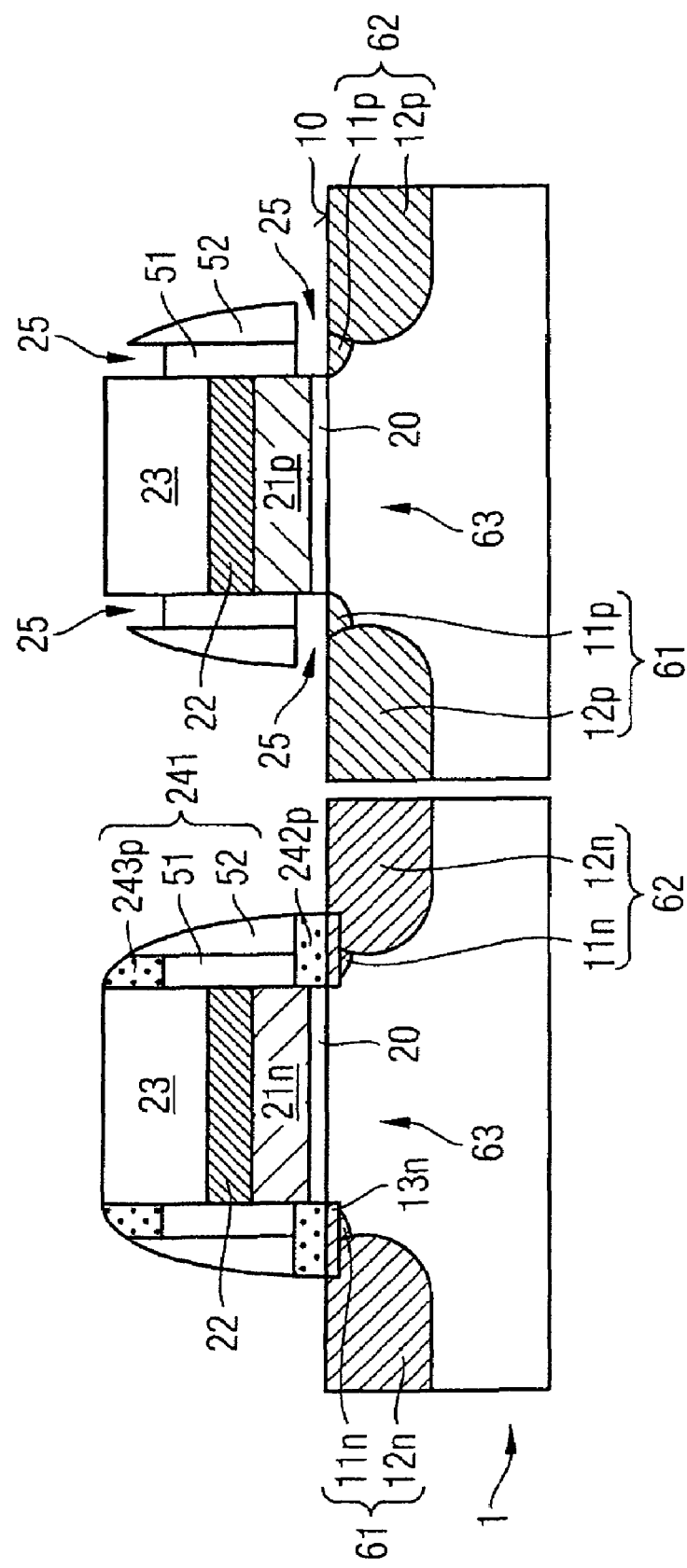

In accordance with FIG. 10B, the residual sections of the deposited dielectric layer fill the former divots 25 that were produced as a result of pulling back the first partial layer 51 in the region of the n-FETs 3n. The dielectric material enhanced with positive charge carriers forms p-doped control sections 242p adjoining the semiconductor substrate 1 and also further p-doped sections 243p adjoining the insulator section 23. The further sections 243p, the residual sections of the first partial layer 51 and also those of the second partial layer 52 form a dielectric remaining section 241 of the spacer structure assigned to the n-FET 3n.

A second mask 42 in accordance with FIG. 9C is applied and an implantation for forming the p-doped basic sections 12p of the p-FETs 3p is performed likewise in accordance with FIG. 9C. The first partial layer is then pulled back isotropically, so that, analogously to the description above, the lower partial layer is pulled back in sections and divots 25 arise between residual sections of the upper partial layer 52 and the semiconductor substrate 1 or the stack structure 72, as can be seen from FIG. 10C.

In accordance with the processing of the n-FETs, the second mask is removed and a dielectric material is deposited under process conditions under which the deposited layer is enhanced with negative charge carriers. The deposited dielectric layer is pulled back isotropically. The finished p-FET 3p is illustrated in the right-hand half of FIG. 10D.

Figure 12:
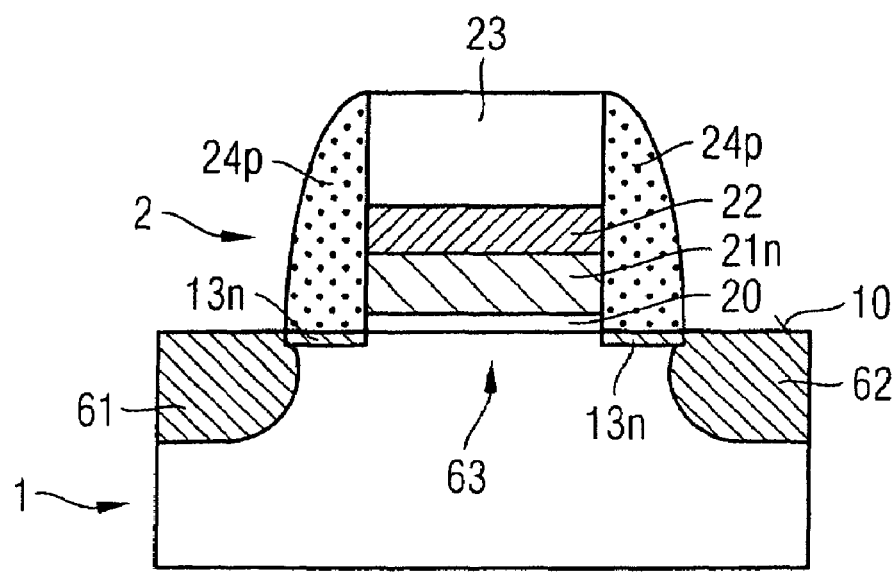
FIG. 12 shows a further exemplary embodiment of an n-channel field effect transistor according to the invention with source/drain regions spaced apart from the channel.

FIG. 12 relates to an exemplary embodiment of an n-FET 3n according to the invention in which the source/drain regions 61, 62 have been drawn back as far as the outer edge of the spacer structures 24p and adjoin the enhancement zones 13n, so that the overlap capacitance is minimized.

EXAMPLE

A surface charge density of 6.0E+12/cm$^2$ in a spacer structure, given a gate voltage of 1 V, leads to the formation of an enhancement zone having a charge carrier density of 2.0E+19/cm$^3$. This corresponds to the customary charge carrier density in the source/drain regions.

Having described preferred embodiments of the invention, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

LIST OF REFERENCE SYMBOLS

1 Semiconductor substrate
10 Structure surface
11$n$ n-doped extension section
11$p$ p-doped extension section
12$n$ n-doped basic section
12$p$ p-doped basic section
13$n$ n-type enhancement zone
13$p$ p-type enhancement zone
2 Gate structure
20 Gate dielectric
21$n$ n-doped gate conductor section
21$p$ p-doped gate conductor section
22 Highly conductive section
23 Insulator section
24 Spacer structure
24$n$ n-doped spacer structure
24$p$ p-doped spacer structure
241 Remaining section
242$n$,242$p$ Control section
243$n$,243$p$ Further section
25 Divot
26 Gate electrode
3$n$ n-FET
3$p$ p-FET
41 First mask
42 Second mask
51 Residual section of first partial layer
52 Residual section of second partial layer
61 First source/drain region
62 Second source/drain region
63 Channel region
71,72 Stack structure
73 Precursor spacer structure

What is claimed is:

1. A field effect transistor structure, comprising:
   a semiconductor substrate;
   first and second source/drain regions formed as sections of a first conductivity type in the semiconductor substrate and adjoining a structure surface of the semiconductor substrate;
   a channel region formed between the source/drain regions, the channel region being intrinsically conducting or doped in accordance with a second conductivity type opposite to the first conductivity type;
   a gate electrode arranged above the channel region;
   a gate dielectric separating the channel region from the gate electrode; and
   a first dielectric spacer structure adjacent the structure surface and adjoining the gate electrode in a manner oriented toward the first source/drain region, the first dielectric spacer structure including a first control section adjoining the semiconductor substrate, the first control section comprising fixed, immobile charge carriers of a second charge type, corresponding to the second conductivity type, wherein the first control section has a surface charge density of greater than 1 e11/cm$^2$.

2. The field effect transistor structure according to claim 1, further comprising:
   a second dielectric spacer structure adjacent the structure surface and adjoining the gate electrode in a manner oriented toward the second source/drain region, the second dielectric spacer structure including a second control section adjoining the semiconductor substrate, the second control section comprising fixed, immobile charge carriers of a second charge type, corresponding to the second conductivity type, wherein the second control section has a surface charge density of greater than 1 e11/cm$^2$.

3. The field effect transistor structure according to claim 2, further comprising:
   first and second enhancement zones respectively induced by the charge carriers in the first and second control sections with mobile charge carriers of a first charge type corresponding to the first conductivity type, wherein the first and second enhancement zones are formed in an adjoining section of the semiconductor substrate adjacent the first and second control sections.

4. The field effect transistor structure according to claim 3, wherein the first enhancement zone separates a portion of the channel region which lies below the gate electrode from the first source/drain region.

5. The field effect transistor structure according to claim 3, wherein the first source/drain region overlies a portion of the first enhancement zone.

6. The field effect transistor structure according to claim 5, wherein the first source/drain region completely overlies the first enhancement zone and adjoins a section of the channel region beneath the gate electrode.

7. The field effect transistor structure according to claim 3, wherein the second enhancement zone separates a portion of the channel region which lies below the gate electrode from the second source/drain region.

8. The field effect transistor structure according to claim 3, wherein the second source/drain region overlies a portion of the second enhancement zone.

9. The field effect transistor structure according to claim 8, wherein the second source/drain region completely overlies the second enhancement zone and adjoins a section of the channel region beneath the gate electrode.

10. The field effect transistor structure according to claim 3,
    wherein in the first enhancement zone, a charge carrier density of the first charge type, during the conducting state of the field effect transistor structure, comprises at least ten percent of the charge carrier density in the respectively adjoining source/drain region; and
    wherein in the second enhancement zone, a charge carrier density of the first charge type, during the conducting state of the field effect transistor structure, comprises at least ten percent of the charge carrier density in the respectively adjoining source/drain region.

11. The field effect transistor structure according to claim 10, wherein the charge carrier density of charge carriers of the first charge type in the first and second enhancement zones, during the conducting state of the field effect transistor structure, essentially corresponds to the charge carrier density in the respectively adjoining source/drain region.

12. The field effect transistor structure according to claim 3, wherein the source/drain regions are formed from a plurality of implantation regions overlying one another.

13. The field effect transistor structure according to claim 3, wherein the first and second control sections respectively comprises the entire first and second dielectric spacer structures.

14. The field effect transistor structure according to claim 3, wherein the first and second control sections have a maximum height not exceeding ten times the thickness of the gate dielectric.

15. The field effect transistor structure according to claim 1, wherein the first and second control sections have a surface charge density greater than 1 e12/cm$^2$.

16. The field effect transistor structure according to claim 1, wherein the first conductivity type is the p conductivity type, and wherein the material of the first control section is aluminum oxide.

17. The field effect transistor structure according to claim 1, wherein the first conductivity type is the n conductivity type and the material of the first control section comprises: silicon oxide, silicon nitride or an oxide of rare earth elements.

18. A transistor arrangement, comprising:
   a first field effect transistor structure according to claim 1, in which the first conductivity type is the n conductivity type; and
   a second field effect transistor structure according to claim 1, in which the first conductivity type is the p conductivity type.

19. The transistor arrangement according to claim 18, wherein:
   control sections of the dielectric spacer structures assigned to the first field effect transistor structure are formed from a first spacer material;
   control sections of the dielectric spacer structures assigned to the second field effect transistor structure are formed from a second spacer material that is different from the first spacer material.

20. The transistor arrangement according to claim 19, wherein:
   the first spacer material comprises: silicon oxide, silicon nitride or an oxide of rare earth elements; and
   the second spacer material comprises aluminum oxide.

21. A method for fabricating transistor arrangements comprising at least one n-FET and at least one p-FET, the method comprising:
   (a) forming a first stack structure and second stack structure on a structure surface of a semiconductor substrate;
   (b) providing first spacer structures having a surface charge density of greater than 1 e11/cm$^2$ of a first charge type on vertical sidewalls of the first and second stack structures;
   (c) providing a first mask covering the second stack structure, wherein the first stack structure remains uncovered;
   (d) removing the first spacer structures from the first stack structure;
   (e) removing the first mask;
   (f) providing second spacer structures having a surface charge density of greater than 1 e11/cm$^2$ of a second charge type which is opposite to the first charge type on vertical sidewalls of the first stack structure and on the second stack structure supplemented by the first spacer structures.

22. The method according to claim 21, further comprising:
   (g) providing a second mask covering the first stack structure, after providing the second spacer structures, wherein the second stack structure remains uncovered;
   (h) removing the second spacer structures from the second stack structure; and
   (i) removing the second mask.

23. The method according to claim 21, wherein the first and second masks are used as implantation masks for forming basic sections of source/drain regions of a respective first and second charge carrier types corresponding to the respective first and second charge types.

24. A method for fabricating transistor arrangements comprising at least one n-FET and at least one p-FET, the method comprising:
   (a) forming a first stack structure and second stack structure on the structure surface of a semiconductor substrate;
   (b) forming precursor spacer structures on vertical sidewalls of the first and second stack structures;
   (c) providing a first mask which covers the second stack structure, where the first stack structure remains uncovered;
   (d) pulling back sections of the precursor spacer structures of the first stack structure which adjoin the semiconductor substrate, thus forming divots between the precursor spacer structures and the semiconductor substrate;
   (e) removing the first mask;
   (f) filling the divots with a material having a surface charge density of greater than 1 e11/cm$^2$ of a first charge type, control sections of the first spacer structures emerging from the filling;
   (g) providing a second mask which covers the first stack structure, wherein the second stack structure remains uncovered;
   (h) pulling back sections of the precursor spacer structures of the second stack structure which adjoin the semiconductor substrate, thus forming divots between the precursor spacer structures and the semiconductor substrate;
   (i) removing the second mask;
   (j) filling the divots with a material having a surface charge density of greater than 1 e11/cm$^2$ of a second charge type opposite to the first charge type, control sections of the second spacer structures emerging from the filling.

25. The method according to claim 24, wherein:
   formation of the precursor spacer structures includes conformal application of first and second partial layers made of different materials and a spacer etch acting on both partial layers; and
   the sections of the precursor spacer structures which adjoin the semiconductor substrate are formed by residual sections of the lower partial layer.

26. The method according to claim 25, wherein the material of the lower partial layer is TEOS and that of the upper partial layer is silicon nitride, and wherein the divots are formed via a wet etching step that selectively pulls back the TEOS relative to the silicon nitride.

27. The method according to claim 24, wherein the first and second masks are used as implantation masks for forming basic sections of source/drain regions of a respective first and second charge carrier types corresponding to the respective first and second charge types.

28. The field effect transistor structure according to claim 1, further comprising:
a first enhancement zone induced by the fixed, immobile charge carriers in the first control section with mobile charge carriers of a first charge type corresponding to the first conductivity type, wherein the first enhancement zone is formed in an adjoining section of the semiconductor substrate adjacent the first control section.

29. The field effect transistor structure according to claim 1, wherein the first control section is doped with the fixed, immobile charge carriers.

30. The field effect transistor structure according to claim 2, further comprising:
a second enhancement zone induced by the fixed, immobile charge carriers in the second control section with mobile charge carriers of a first charge type corresponding to the first conductivity type, wherein the second enhancement zone is formed in an adjoining section of the semiconductor substrate adjacent the second control section.

31. The field effect transistor structure according to claim 2, wherein the second control section is doped with the fixed, immobile charge carriers.

* * * * *